Sept. 6, 1966 R. WAGNER 3,271,635

SEMICONDUCTOR DEVICES WITH SILVER-GOLD LEAD WIRES ATTACHED TO ALUMINUM CONTACTS

Filed May 6, 1963

2 Sheets-Sheet 1

INVENTOR.
ROBERT WAGNER

BY

W.S. Hill
AGENT

INVENTOR.
ROBERT WAGNER
BY
W.S. Hill
AGENT

United States Patent Office 3,271,635

Patented Sept. 6, 1966

3,271,635

SEMICONDUCTOR DEVICES WITH SILVER-GOLD LEAD WIRES ATTACHED TO ALUMINUM CONTACTS

Robert Wagner, Levittown, N.J., assignor to Radio Corporation of America, a corporation of Delaware Filed May 6, 1963, Ser. No. 278,240
3 Claims. (Cl. 317—234)

This invention relates to improved semiconductor devices. More particularly, this invention relates to improved electrical connections to semiconductor devices.

In the manufacture of semiconductor devices such as diodes, triodes, tetrodes, and the like utilizing as the substrate, crystalline wafers composed of semiconductive materials, it is frequently necessary to make an electrical connection to a semiconductive wafer. The wafer may consist of silicon, silicon-germanium alloys, germanium, and the like. Since it is difficult to bond a metallic electrical lead wire directly to a semiconductive wafer, it has heretofore been the usual practice to deposit a metallic mass or contact on at least a portion of the wafer, and then bond the electrical lead wire to the metallic mass. The mass may consist of a pure metal such as aluminum, gold, or the like. Alternatively, the mass may consist of a mixture or alloy of several metals, and may include a substance which is a conductivity modifier or doping agent in the particular semiconductor.

In some types of semiconductor devices, at least a portion of the surface of the device is covered by an insulating layer such as magnesium fluoride, silicon oxide, and the like, which may be deposited by evaporation. See, for example, U.S. 2,796,562, issued to S. G. Ellis et al. on June 18, 1957, and assigned to the assignee of this application. The insulating layer may consist of magnesium oxide, as described in U.S. 2,805,968 issued to G. E. Dunn, Jr., on September 10, 1957. An insulating silicon oxide layer may be formed on the surface of a semiconductive wafer by thermal decomposition of a siloxane compound. In other semiconductor devices, the insulating layer consists of silicon oxide formed by an oxidizing bath or by anodic oxidation, as described in U.S. 2,875,384, issued to J. T. Wallmark on February 24, 1950, and assigned to the assignee of this application. When the semiconductor device is formed from a silicon wafer, the silicon oxide layer on the surface of the device may be formed by heating the wafer in an oxidizing atmosphere which includes water vapor, as described in U.S. 2,802,760, issued to Derick et al. on October 13, 1957.

In the fabrication of some semiconductor devices, particularly silicon devices having a silicon oxide coating upon a portion of the device surface, it has been found difficult to form stable electrical connections to the semiconductive substrate wafer where the metals involved in the connection include aluminum and gold. The defective devices have been found to exhibit a purple discoloration of the wafer surface in the region where the electrical connections are made. The discoloration is believed due to the formation of brittle intermetallic compounds such as $AuAl_2$. This problem has been described in the semiconductor manufacturing art as the "purple plague," and has caused a high scrap rate in the manufacture of these types of semiconductor devices.

Accordingly, it is an object of this invention to provide improved semiconductor devices.

Another object of the invention is to provide improved electrical connections to semiconductive bodies.

But another object is to provide improved silicon semiconductor devices having improved stability and operating life.

These and other objects are attained by improved semiconductor devices which include a metallic contact which includes aluminum on the surface of a semiconductive wafer, and, bonded to the aforesaid metallic contact an electrical lead wire consisting essentially of an alloy of 5 to 25 weight percent silver, balance gold.

The invention will be described in greater detail by the following example, considered in conjunction with the accompanying drawing, in which.

*Example*

Figures 1, 2, 3:
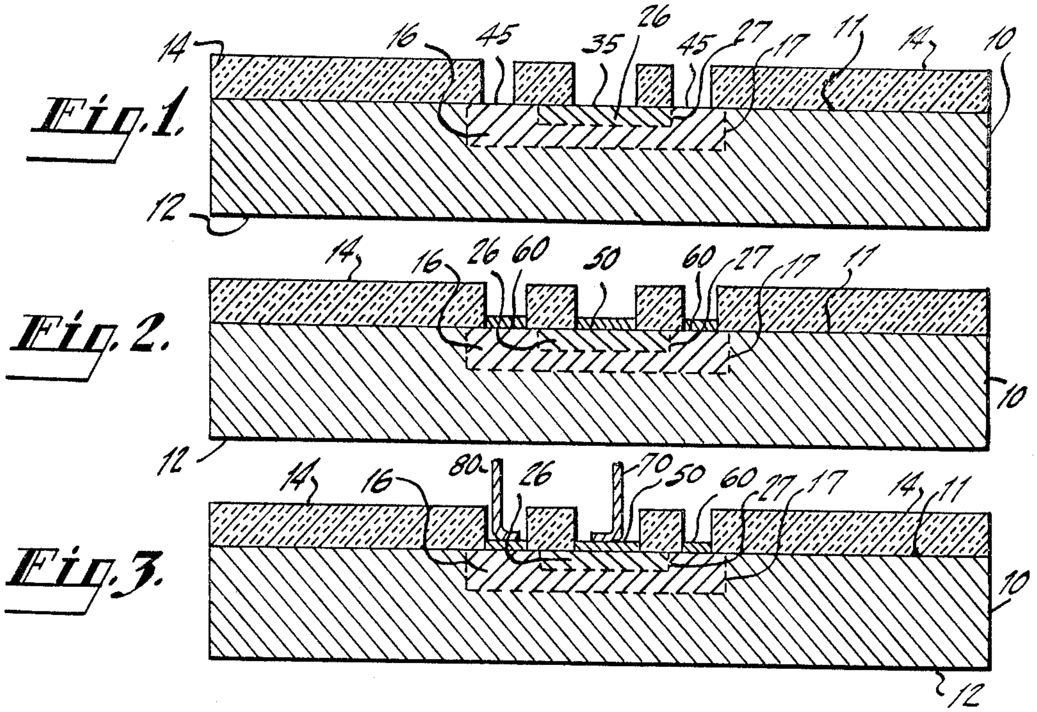
FIGURES 1–3 are cross-sectional views of a semiconductive wafer during successive steps in the fabrication of a semiconductor device according to one embodiment.

A semiconductor wafer 10 (FIGURE 1) of crystalline semiconductive material is prepared with two opposing major faces 11 and 12. The semiconductor material may consist of silicon, silicon-germanium alloys, germanium, or the like. In this example, wafer 10 consists of monocrystalline silicon. The exact size and shape of semiconductive wafer 10 is not critical. In this example, wafer 10 is about 50 mils per square and 5 mils thick. The semiconductive wafer may be of either conductivity type, or intrinsic, or compensated. In this example, wafer 10 is of N-type conductivity. A layer 14 of silicon oxide is deposited on major wafer face 11 by any convenient method. When the wafer consists of material other than silicon, such as germanium, gallium arsenide, or the like, the silicon oxide layer 14 may be deposited by thermally decomposing a siloxane compound, and passing the vaporized decomposition products of the compound over the surface of the wafer. When the wafer 10 consists of silicon, as in this example, the silicon oxide layer 14 may be formed by heating wafer 10 in steam for about 30 minutes at about 1100° C.

A portion of layer 14 is removed, and a P-type region 16 is formed by diffusing a suitable impurity, such as boron, into the exposed portion of face 11 of wafer 10. A p-n junction 16 is thus formed between N-type wafer 10 and P-type region 16. In a similar manner, an N-type region 26 is then formed by diffusing an N-type impurity, such as phosphorus, into a portion of the P-type region 16. A second p-n junction 27 is thus formed between regions 16 and 26.

After the silicon oxide layer 14 is reformed on face 11, a circular opening 35 is provided in the insulating layer 14 so that a central portion of the region 26 is exposed. By a similar process, an annular shaped opening 45 is provided in insulating layer 14 so that a portion of the region 16 is exposed. The annular shaped opening 45 may be concentric with the opening 35, although there may be other shapes and locations of these openings. Referring to FIGURE 2, aluminum is deposited on the exposed portions of wafer face 11, for example by evaporation, thereby forming a metallic contact 50 to the N-type region 26 (which may serve as the emitter of a transistor), and a metallic contact 60 to the P-type region 16 (which may serve as the base region of the device).

As shown in FIG. 3, an electrical lead wire 70 is now attached to emitter contact 50, and another electrical lead wire 80 is attached to the ring-shaped or annular base contact 60. The connection between the lead wires and the metallic contacts may be made by any convenient method, including soldering. In this example, wires 70 and 80 are attached to contacts 50 and 60 respectively by means of thermocompression bonds. In accordance with this embodiment, the lead wires 70 and 80 are composed of an alloy consisting essentially of 5 to 25 weight percent silver, balance gold. In this example, the specific alloy utilized consists essentially of 17 weight percent silver and 83 weight percent gold. The remaining steps of mounting wafer 10 on a base plate, and casing the device, are accomplished by techniques known to the art.

It has unexpectedly been found that when semiconductor devices having aluminum contacts on one major wafer face are fabricated as described above, with electrical lead wires consisting essentially of 5 to 25 weight percent silver, balance gold, attached to the aforesaid metallic contacts, the manufacturing problem known as "purple plague" is virtually eliminated. As a result, there is a sharp decrease in the scrap rate.

Figure 4:
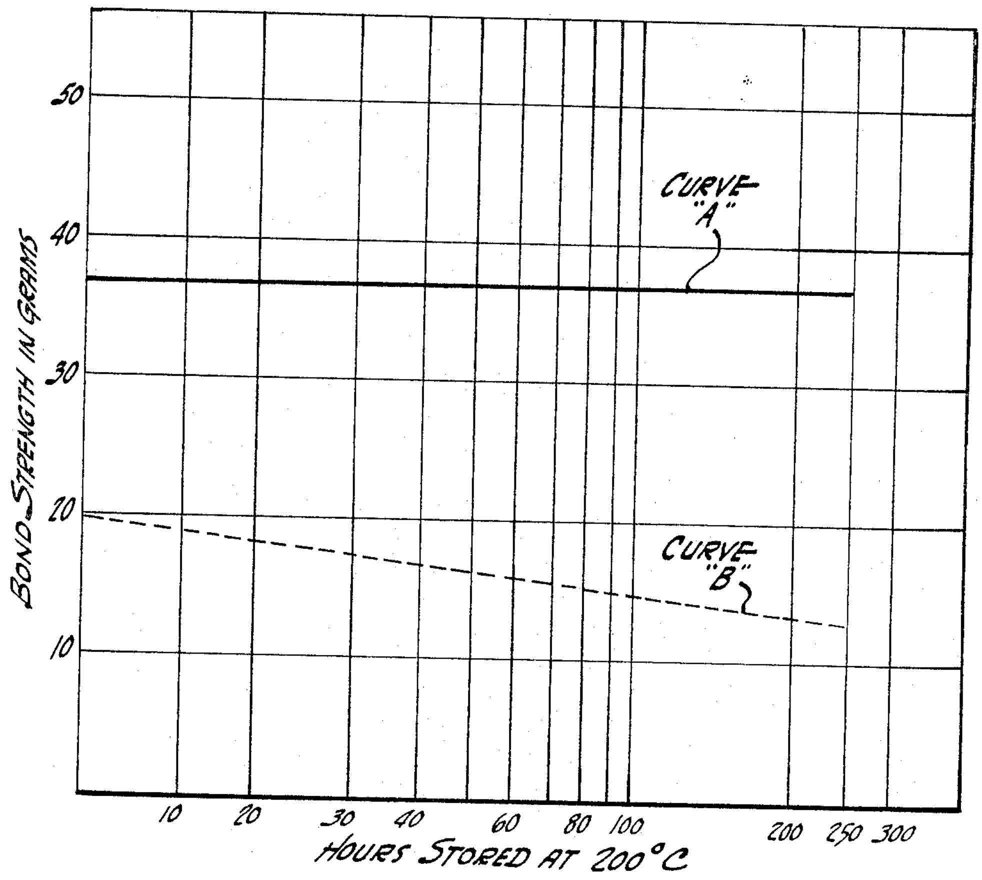
FIGURE 4 is a plot showing the variation in bond strength during storage at 200° C. for a semiconductor device according to the invention and a similar device according to the prior art; and, FIGURE 5 is a plot showing the variation in depth of aluminum diffusion into gold-silver lead wires of varying silver content for semiconductor devices stored 265 hours at 300° C.

The improvement in bond strength obtained by the method of the invention is illustrated in FIGURE 4, which is a semilogarithmic graph showing the time variation of the bond strength of electrical leads attached to metallic contacts on crystalline semiconductive wafers. A group of silicon transistors were fabricated as described in the above example, utilizing an alloy of 83 weight percent gold–17 weight percent silver for the lead wires. A similar group of control units were fabricated according to the prior art, utilizing pure gold for the lead wires. Both groups were stored together for 250 hours in an oven maintained at 200° C. Periodically, some of the units were withdrawn, and the bond strength of the leads was measured by noting the force in grams required to pull the lead wires away from aluminum contacts on the silicon transistors. The bond strength of the lead wires in the devices according to the invention varied as shown by the solid curve A in FIGURE 4. The bond strength of these units was originally about 37 grams. After 250 hours storage at 200° C., the decline in the bond strength was so small that the units still tested over 36 grams. In contrast, the bond strength of the pure gold lead wires in the devices made according to the prior art varied as shown by the dashed curve B in FIGURE 4. The initial value of the bond strength of the prior art units was about 20 grams, which is barely acceptable. During storage at 200° C., the bond strength of the prior art units declined steadily to less than 14 grams, which is too low to be acceptable.

Figure 5:
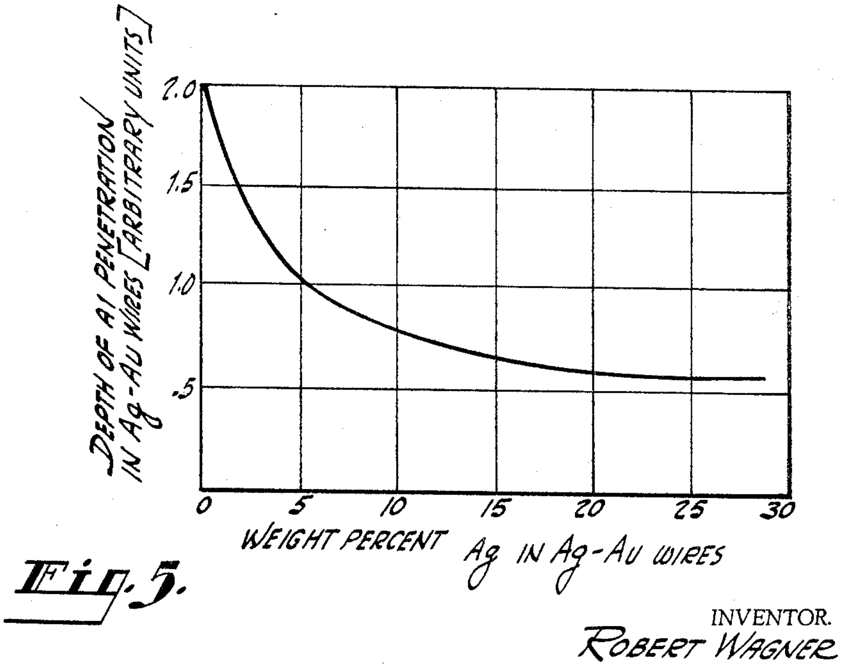

The exact reasons for the striking improvement thus obtained are not presently clear, but it is thought that the silver present in the lead wires slows down the diffusion of aluminum into the wire, and thus prevents or minimizes the formation of $AuAl_2$. When the lead wires contain more than 25 weight percent silver, bonding to aluminum contacts becomes difficult. When the lead wires contain less than 5 weight percent silver, they are not sufficiently effective in preventing the diffusion of aluminum into the wire and thus preventing purple plague. In FIGURE 5 the depth of aluminum penetration into silver-gold lead wires of varying silver content is plotted for devices stored 265 hours at 300° C. The ordinate represents depth of aluminum penetration into the wire in arbitrary units, with the penetration into wire containing 5 weight percent silver–95 weight percent gold taken as 1.0 or unity. The depth of aluminum penetration for wires containing less than 5 weight percent silver rises sharply, and penetration is doubled for pure gold wire. The depth of aluminum penetration for wires containing more than 5 weight percent silver declines gradually with increasing silver content. The use of lead wire consisting of 17 weight percent silver, balance gold, appears to give optimum results as to ease of bonding and elimination of purple plague.

It will be understood that the above example of a preferred form of the invention is by way of illustration only and not limitation, since various modifications and variations may be made in its application by those skilled in the art without departing from the spirit and scope of the invention as defined in the appended claims. For example, the semiconductor devices may be made of materials other than silicon. The metallic contacts on the surface of the device may be made of aluminum alloys as well as pure aluminum.

There has thus been described improved semiconductor devices.

What is claimed is:

1. A semiconductor device comprising a crystalline semiconductive wafer; at least one metallic contact comprising aluminum on a portion of said wafer; and an electrical lead wire attached to said contact, said wire consisting essentially of 5 to 25 weight percent silver, balance gold.

2. A semiconductor device comprising a silicon wafer; at least one metallic contact comprising aluminum on a portion of said wafer; and an electrical lead wire attached to said contact, said wire consisting essentially of 5 to 25 weight percent silver, balance gold.

3. A semiconductor device comprising a silicon wafer; at least one aluminum contact on a portion of said wafer; and an electrical lead wire attached to said contact, said wire consisting of 17 weight percent silver and 83 weight percent gold.

References Cited by the Examiner

UNITED STATES PATENTS

| | | | |
|---|---|---|---|
| 2,793,332 | 5/1957 | Alexander et al. | 317—235 |
| 3,140,536 | 7/1964 | Kuznetzoff | 75—165 |
| 3,190,954 | 6/1965 | Pomerantz | 317—235 |
| 3,202,489 | 8/1965 | Bender et al. | 317—235 |

JOHN W. HUCKERT, *Primary Examiner.*

J. D. CRAIG, *Assistant Examiner.*